(12) United States Patent
Okazaki et al.

(10) Patent No.: US 8,514,019 B2
(45) Date of Patent: Aug. 20, 2013

(54) DISTORTION COMPENSATION AMPLIFIER

(75) Inventors: Takashi Okazaki, Yokohama (JP); Yoshiaki Doi, Tokyo (JP)

(73) Assignees: Hitachi Kokusai Electric Inc., Tokyo (JP); NEC Corporation, Tokyo (JP)

( * ) Notice: Subject to any disclaimer, the term of this patent is extended or adjusted under 35 U.S.C. 154(b) by 113 days.

(21) Appl. No.: 13/140,159

(22) PCT Filed: Nov. 20, 2009

(86) PCT No.: PCT/JP2009/006264
§ 371 (c)(1),
(2), (4) Date: Aug. 29, 2011

(87) PCT Pub. No.: WO2010/073483
PCT Pub. Date: Jul. 1, 2010

(65) Prior Publication Data
US 2011/0298536 A1    Dec. 8, 2011

(30) Foreign Application Priority Data
Dec. 22, 2008 (JP) ................................. 2008-325004

(51) Int. Cl.
*H03F 1/26* (2006.01)
*H04B 1/04* (2006.01)
*H04K 1/02* (2006.01)

(52) U.S. Cl.
USPC ......... 330/149; 455/114.3; 375/296; 375/297

(58) Field of Classification Search
USPC ....... 330/107, 149; 455/114.3; 375/296–297
See application file for complete search history.

(56) References Cited

U.S. PATENT DOCUMENTS

| 6,275,685 B1 * | 8/2001 | Wessel et al. ............... 455/126 |
| 2005/0068102 A1 | 3/2005 | Hongo et al. |
| 2007/0200625 A1 | 8/2007 | Shako et al. |

FOREIGN PATENT DOCUMENTS

| JP | 2005-101908 | 4/2005 |
| JP | 2007-195056 | 8/2007 |
| JP | 2007-221245 | 8/2007 |

OTHER PUBLICATIONS

International Search Report issued Dec. 22, 2009 in International (PCT) Application No. PCT/JP2009/006264.

* cited by examiner

*Primary Examiner* — Robert Pascal
*Assistant Examiner* — Khiem Nguyen
(74) *Attorney, Agent, or Firm* — Wenderoth, Lind & Ponack, LLP

(57) ABSTRACT

A distortion compensation amplifier that performs distortion compensation with a pre-distortion scheme. The distortion compensation amplifier includes a power detection unit (1), a distortion compensation aspect storing unit (3), a distortion providing unit (4) for performing distortion compensation, and an amplifier for amplifying a signal. Feedback signal taking section (9, 11 to 16) for taking a feedback signal, and a distortion level detecting section (9, 11, 12, 17, and 18) for detecting the level of distortion contained in the feedback signal. A controller (19) updates the storage content of the distortion compensation aspect storing unit so as to reduce the error component between the signal to be amplified and the feedback signal at the time of start of distortion compensation processing, and updates the content of the distortion compensation aspect storing unit so as to reduce the detected level of distortion when the error component is reduced.

6 Claims, 4 Drawing Sheets

DISTORTION COMPENSATION AMPLIFIER

BACKGROUND OF THE INVENTION

1. Technical Field

The present invention relates to a distortion compensation amplifier which compensates for nonlinear distortion of an amplifier with a pre-distortion scheme, and more particularly, to a distortion compensation amplifier which accelerates the convergence of distortion compensation and improves the performance of distortion compensation.

2. Description of the Related Art

For example, a base station apparatus provided for a mobile communication system needs to transmit a radio signal to the position of a physically remote mobile station apparatus, the signal needs to be amplified significantly by an amplifier. However, the amplifier is an analog device and its input/output characteristics represent a nonlinear function. Especially, after the amplification limit called a saturation point, the output power is substantially constant even when the power input to the amplifier is increased. The nonlinear output produces nonlinear distortion.

In a signal for transmission before amplification, a signal component outside a desired signal band is reduced to a low level by a band limiting filter. In a signal after passage through the amplifier, however, the nonlinear distortion is produced to leak a signal component outside the desired signal band (to an adjacent channel). For example, since the base station apparatus has the high transmission power as described above, the magnitude of the power leaked to the adjacent channel is strictly specified, and how to reduce the power leaked to the adjacent channel presents a serious problem. A pre-distortion scheme is one of distortion compensation schemes and has been replacing a feed-forward scheme and becoming predominant since great importance has been put on the amplification efficiency in recent years.

To reduce the distortion to a low level with the pre-distortion scheme, a pre-distorter previously supplies a signal with the distortion of inverse characteristics of AM/AM characteristics and AM/PM characteristics of the amplifier to momentary power, and the signal supplied with the inverse characteristics is input to the amplifier, so that the output from the amplifier has linear characteristics with nonlinear regions canceled out. Thus, the distortion can be reduced to a low level while high efficiency is maintained.

FIG. 3 shows a configuration example of an amplifier with distortion compensation (distortion compensation amplifier) using the pre-distortion scheme of distortion power detection type.

An example of operation performed by the distortion compensation amplifier of the present example will be shown.

A power detection section 101 detects the power (or the amplitude) of an IQ digital signal input thereto, and an address calculation section 102 calculates a reference address for a distortion compensation table 103 formed of a memory or the like. The distortion compensation table 103 has a table stored therein for performing the distortion compensation with the pre-distortion scheme and outputs a distortion compensation value associated with the value calculated by the address calculation section 102 to a pre-distorter section 104.

Inverse characteristics of nonlinear AM/AM characteristics and AM/PM characteristics of an amplifier to be compensated for and correction values for compensating for distortion due to a memory effect are stored in the distortion compensation table 103. In the present example, the distortion compensation table 103 is stored after deployment to an amplitude table and a phase table within a control section 115 and then rectangular coordinate conversion to an I, Q table.

The pre-distorter section 104 performs complex multiplication of the reference result from the distortion compensation table 103 and the input signal. The resulting signal previously supplied with the distortion in the pre-distortion scheme is converted into an analog signal through a D/A (Digital to Analog) converter 105 and is converted into an RF (Radio Frequency) signal by a frequency conversion section 106. Then, the signal is amplified by an amplification section 107 into an output signal including no distortion which is output from an antenna 108.

Part of the output signal is taken out by a directional coupler 109, frequency-converted as a feedback signal into a signal of IF (Intermediate Frequency) band by a frequency conversion section 111, converted into a digital signal by an A/D (Analog to Digital) converter 112, and converted from time-base data to frequency-base data by an FFT (Fast Fourier Transform) section 113. Distortion power is calculated by a distortion band power calculation section 114 from the data after the FFT processing. The control section 115 updates the distortion compensation table 103 so as to reduce the feedback distortion power from the distortion band power calculation section 114, and performs adaptive control in order to follow temperature changes or the like.

FIG. 4 shows a configuration example of an amplifier with distortion compensation (distortion compensation amplifier) using the pre-distortion scheme of input/output signal comparison type.

An example of operation performed by the distortion compensation amplifier of the present example will be shown.

A power detection section 201 detects the power (or the amplitude) of an IQ digital signal input thereto, and an address calculation section 202 calculates a reference address for a distortion compensation table 203 formed of a memory or the like. The distortion compensation table 203 has a table stored therein for performing the distortion compensation with the pre-distortion scheme and outputs a distortion compensation value associated with the value calculated by the address calculation section 202 to a pre-distorter section 204.

Inverse characteristics of nonlinear AM/AM characteristics and AM/PM characteristics of an amplifier to be compensated for and correction values for compensating for distortion due to a memory effect are stored in the distortion compensation table 203. In the present example, the distortion compensation table 103 is stored after deployment to an amplitude table and a phase table within a control section 217 and then rectangular coordinate conversion to an I, Q table.

The pre-distorter section 204 performs complex multiplication of the reference result from the distortion compensation table 203 and the input signal. The resulting signal previously supplied with the distortion in the pre-distortion scheme is converted into an analog signal through a D/A converter 205 and is converted into an RF signal by a frequency conversion section 206. Then, the signal is amplified by an amplification section 207 into an output signal including no distortion which is output from an antenna 208.

Part of the output signal is taken out by a directional coupler 209, frequency-converted as a feedback signal into a signal of IF band by a frequency conversion section 211, converted into a digital signal by an A/D converter 212, and provided as an IQ signal by a quadrature detection section 213. For the I and Q feedback signal, a feedback level correction section 214 adjusts the level between the input signal and the feedback signal, a feedback delay correction section 215 adjusts the delay between the input signal and the feedback signal, a feedback phase difference correction section 216 adjusts the phase difference between the input signal and the feedback signal, and then the signal is input to the control section 217. The control section 217 detects an error component from the input signal and the feedback signal, updates the distortion compensation table 203 so as to reduce the error component, and performs adaptive control in order to follow temperature changes or the like.

See prior art reference: JP-A-2004-343496.

SUMMARY OF THE INVENTION

1. Problems that the Invention is to Solve

In the distortion compensation amplifier with the pre-distortion scheme of the distortion power detection type as shown in FIG. 3, however, the detection value serving as the index of distortion compensation control only indicates an increase or a reduction in distortion power. Thus, the distortion compensation table 103 is difficult to determine uniquely and needs to be updated many times, so that there has been a problem in that a long convergence time is required.

On the other hand, in the distortion compensation amplifier with the pre-distortion scheme of the input/output signal comparison type as shown in FIG. 4, the comparison between the input signal and the feedback signal makes it easy to find the optimal point, so that the distortion compensation table 203 needs to be updated a small number of times and thus the convergence time is reduced. However, there has been a problem in that, when the input signal and the feedback signal cannot be compared correctly, the amount of distortion compensation is deteriorated accordingly. In other words, while the distortion compensation amplifier with the pre-distortion scheme of the distortion power detection type can perform control so as to reduce the distortion even when the feedback signal has poor signal quality, the distortion compensation amplifier with the pre-distortion scheme of the input/output signal comparison type has the problem in that the distortion compensation operation is stopped if it is determined that the convergence is achieved, even when the distortion remains.

The present invention has been made in view of the conventional situations, and it is an object thereof to provide a distortion compensation amplifier which can accelerate the convergence of distortion compensation and improve the performance of distortion compensation in compensating for non-linear distortion of the amplifier with the pre-distortion scheme.

2. Means for Solving the Problems

To achieve the abovementioned object, a distortion compensation amplifier performing distortion compensation with the pre-distortion scheme is configured as follows in the present invention.

Specifically, level detecting means detects the level of a signal to be amplified. Distortion compensation aspect storing means stores a distortion compensation aspect associated with the level detected by the level detecting means. Distortion providing means provides distortion of pre-distortion (predetermined distortion) for the signal to be amplified in the distortion compensation aspect associated with the level detected by the level detecting means based on the storage content of the distortion compensation aspect storing means. Amplifying means amplifies the signal provided with the distortion of pre-distortion by the distortion providing means. Feedback signal taking means performs the detection of the signal amplified by the amplifying means to take a feedback signal. Distortion level detecting means detects the level of distortion contained in the feedback signal for the signal amplified by the amplifying means.

Control means performs switching such that first update processing of updating the storage content of the distortion compensation aspect storing means is performed so as to reduce an error component between the signal to be amplified and the feedback signal taken by the feedback signal taking means at the time of start of distortion compensation processing and second update processing of updating the storage content of the distortion compensation aspect storing means is performed so as to reduce the level of distortion detected by the distortion level detecting means when the error component is reduced to satisfy a predetermined condition using a predetermined threshold.

Thus, the first update processing with a smaller amount of distortion compensation but quicker convergence is performed at the time of start of distortion compensation processing, and when the abovementioned error component is reduced to a predetermined degree (that is, when convergence is realized to a predetermined degree), switching is made to perform the second update processing with slower convergence but a favorable amount of distortion compensation. This can generally accelerate the convergence of distortion compensation and improve the performance of distortion compensation in compensating non-linear distortion of the amplifier with the pre-distortion scheme.

As the level, it is possible to use the level of the power or the level of the amplitude, for example.

The distortion compensation aspect storing means can be configured by using a memory, for example.

Various items can be used as the distortion compensation aspect. For example, it is possible to use a control value for controlling the amplitude or the phase of the distortion of pre-distortion provided by the distortion providing means.

The predetermined condition using the predetermined threshold in the first update processing may be set in various manners. For example, it is possible to set a condition which can ensure that the abovementioned error component is sufficiently reduced.

3. Advantage of the Invention

As described above, the distortion compensation amplifier according to the present invention can accelerate the convergence of distortion compensation and improve the performance of distortion compensation in compensating non-linear distortion of the amplifier with the pre-distortion scheme.

DETAILED DESCRIPTION OF THE INVENTION

An embodiment according to the present invention will be described with reference to the drawings.

Figure 1:
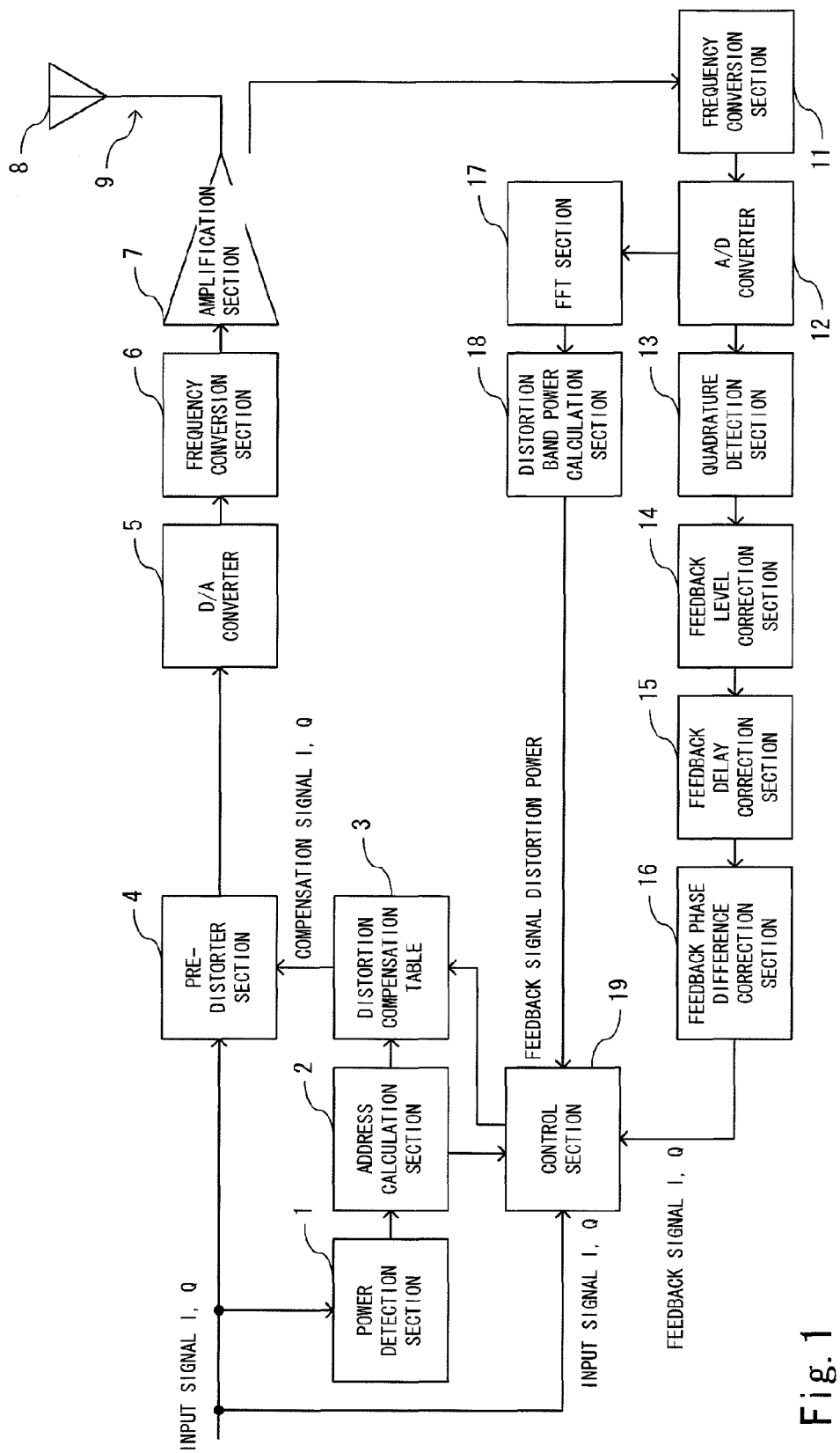
FIG. 1 is a diagram showing a configuration example of a distortion compensation amplifier according to one embodiment of the present invention.

FIG. 1 shows a configuration example of an amplifier with distortion compensation (distortion compensation amplifier) using the pre-distortion scheme according to an embodiment of the present invention.

The distortion compensation amplifier of the present example includes a power detection section 1, an address calculation section 2, a distortion compensation table 3, a pre-distorter section 4, a D/A converter 5, a frequency conversion section 6, an amplification section 7, an antenna 8, a directional coupler 9, a frequency conversion section 11, an A/D converter 12, a quadrature detection section 13, a feedback level correction section 14, a feedback delay correction section 15, a feedback phase difference correction section 16, an FFT section 17, a distortion band power calculation section (distortion power detection section) 18, and a control section 19.

An example of operation performed by the distortion compensation amplifier of the present example will be shown.

The distortion compensation amplifier of the present example is provided for a transmitter which transmits a signal to be transmitted wirelessly, for example. A signal (digital complex signal) including an I component and a Q component to be transmitted is input to the distortion compensation amplifier of the present example, and this signal is input to the power detection section 1, the pre-distorter section 4, and the control section 19.

The power detection section 1 detects the power of the input IQ digital signal and outputs the detection result (the value of the power in the present example) to the address calculation section 2. While the present example is configured to detect the power, the amplitude may be detected instead of the power and that amplitude value may be used in the subsequent processing as another configuration example.

The address calculation section 2 calculates the address value (reference address) for the distortion compensation table 3 based on the power value input from the power detection section 1 and outputs the calculated address value to the distortion compensation table 3 and the control section 19. In the present example, an expression for calculating the reference address from the power value is previously set and stored in a memory and is used for the calculation.

The distortion compensation table 3 is formed by using a memory or the like, has a table stored therein for performing distortion compensation with the pre-distortion scheme, and outputs a distortion compensation value (compensation signal for I and Q in the present example) associated with the value (reference address) input from the address calculation section 2 to the pre-distorter section 4.

In the present example, the correspondence between the reference address and the distortion compensation value is stored in the table of the distortion compensation table 3.

In the present example, inverse characteristics of nonlinear AM/AM characteristics and AM/PM characteristics of an amplifier to be compensated for (amplifier of the amplification section 7 in the present example) and correction values for compensating for distortion (distortion compensation value for compensating both in the present example) due to a memory effect are stored in the distortion compensation table 3. The content of the table of the distortion compensation table 3 is stored after deployment to an amplitude table and a phase table within the control section 19 and then rectangular coordinate conversion to an I, Q table.

The pre-distorter section 4 performs complex multiplication of the reference result (the compensation signal for I and Q serving as distortion compensation value in the present example) from the distortion compensation table 3 and the input signal (the input IQ digital signal in the present example). This previously supplies distortion with the pre-distortion scheme to the input signal, and the resulting signal previously supplied with the distortion is output to the D/A converter 5.

The D/A converter 5 converts the signal input thereto from the pre-distorter section 4 from digital signal to analog signal and outputs the analog signal to the frequency conversion section 6.

The frequency conversion section 6 frequency-converts the signal input thereto from the D/A converter 5 into a radio frequency (RF) signal and outputs the signal to the amplification section 7.

The amplification section 7 amplifies the signal input thereto from the frequency conversion section 6 and outputs the signal to the antenna 8. The signal output from the amplification section 7 is ideally free from distortion since the distortion supplied by the pre-distorter section 4 and the distortion produced in the amplification section 7 canceled each other out.

The antenna 8 wirelessly transmits the signal input thereto from the amplification section 7.

The directional coupler 9 takes out part of the signal output from the amplification section 7 to the antenna 8 and outputs the part of the signal as a feedback signal to the frequency conversion section 11.

The frequency conversion section 11 frequency-converts the signal input thereto from the directional coupler 9 into a signal of intermediate frequency (IF) band and outputs the signal to the A/D converter 12.

The A/D converter 12 converts the signal input thereto from the frequency conversion section 11 from analog signal to digital signal and outputs the signal to the quadrature detection section 13 and the FFT section 17.

The quadrature detection section 13 quadrature-detects the signal input thereto from the A/D converter 12 into an IQ signal (signal including an I component and a Q component) and outputs a feedback signal of I and Q obtained therefrom to the feedback level correction section 14.

The feedback level correction section 14 adjusts the level of the feedback signal of I and Q input thereto from the quadrature detection section 13 to adjust the relationship between the levels of the input signal and the feedback signal and outputs the result to the feedback delay correction section 15.

The feedback delay correction section 15 adjusts the delay (delay time) of the feedback signal of I and Q input thereto from the feedback level correction section 14 to adjust the relationship between the delays of the input signal and the feedback signal and outputs the result to the feedback phase difference correction section 16.

The feedback phase difference correction section 16 adjusts the phase difference of the feedback signal of I and Q input thereto from the feedback delay correction section 15 to adjust the relationship between the phase differences of the input signal and the feedback signal and outputs the result to the control section 19.

In the present example, the aspect of the level correction performed by the feedback level correction section 14, the aspect of the delay correction performed by the feedback delay correction section 15, and the aspect of the phase difference correction performed by the feedback phase difference correction section 16 are previously set, for example in accordance with the circuit configuration of the distortion compensation amplifier of the present example. In comparing the input signal (the IQ digital signal input to the distortion compensation amplifier in the present example) with the feedback signal (the feedback signal of I and Q input to the control section 19 in the present example), the correction aspect is used in which their original signals (base signals) other than the distortion component are identical (or substantially identical). In other words, the present example is configured such that the error between the input signal and the feedback signal reflects the distortion component (as much as possible).

The FFT section 17 performs FFT processing on the signal (data converted into the digital signal) input thereto from the A/D converter 12 to convert the signal from time data to frequency-base data and outputs the data to the distortion band power calculation section 18.

The distortion band power calculation section 18 calculates the value of the power (distortion power) of the distortion component contained in the feedback signal based on the data input from the FFT section 17 and outputs the calculation result (the value of the distortion power) to the control section 19.

The distortion band power calculation section 18 of the present example has a frequency band of distortion previously set and stored in a memory and calculates, as the distortion power, the power of a frequency band falling within the stored frequency band of distortion (for example, the integral value or the average value when plural frequency bands fall within the band) of the data input from the FFT section 17.

While the present example is configured to detect the power of the distortion, the amplitude may be detected instead of the power and that amplitude value may be used in the subsequent processing as another configuration example.

The control section 19 controls the content of the table of the distortion compensation table 3 by selectively switching according to the circumstances between the use of an aspect (a first control mode) in which the signal (data) input from the feedback phase difference correction section 16 is used to control the distortion compensation and the use of an aspect (a second control mode) in which the signal (data) input from the distortion band power calculation section 18 is used to control the distortion compensation. Such adaptive control allows the following of temperature changes or the like.

Specifically, when the signal (data) input from the feedback phase difference correction section 16 is used, the control section 19 detects the error component between the input signal (the IQ digital signal input to the distortion compensation amplifier in the present example) and the feedback signal of I and Q input from the feedback phase difference correction section 16 and updates the content of the table of the distortion compensation table 3 so as to reduce the detected error component. On the other hand, when the signal (data) input from the distortion band power calculation section 18 is used, the control section 19 updates the content of the table of the distortion compensation table 3 so as to reduce the distortion power (contained in the feedback signal) input from the distortion band power calculation section 18.

The control section 19 can specify, for example, the address (power of the input signal) of the distortion compensation table 3 associated with the feedback signal input from the feedback system and the distortion power based on the reference address input from the address calculation section 2 and can specify a target for update in the distortion compensation table 3 (that is, the distortion compensation value associated with the reference address of interest).

Figure 2:
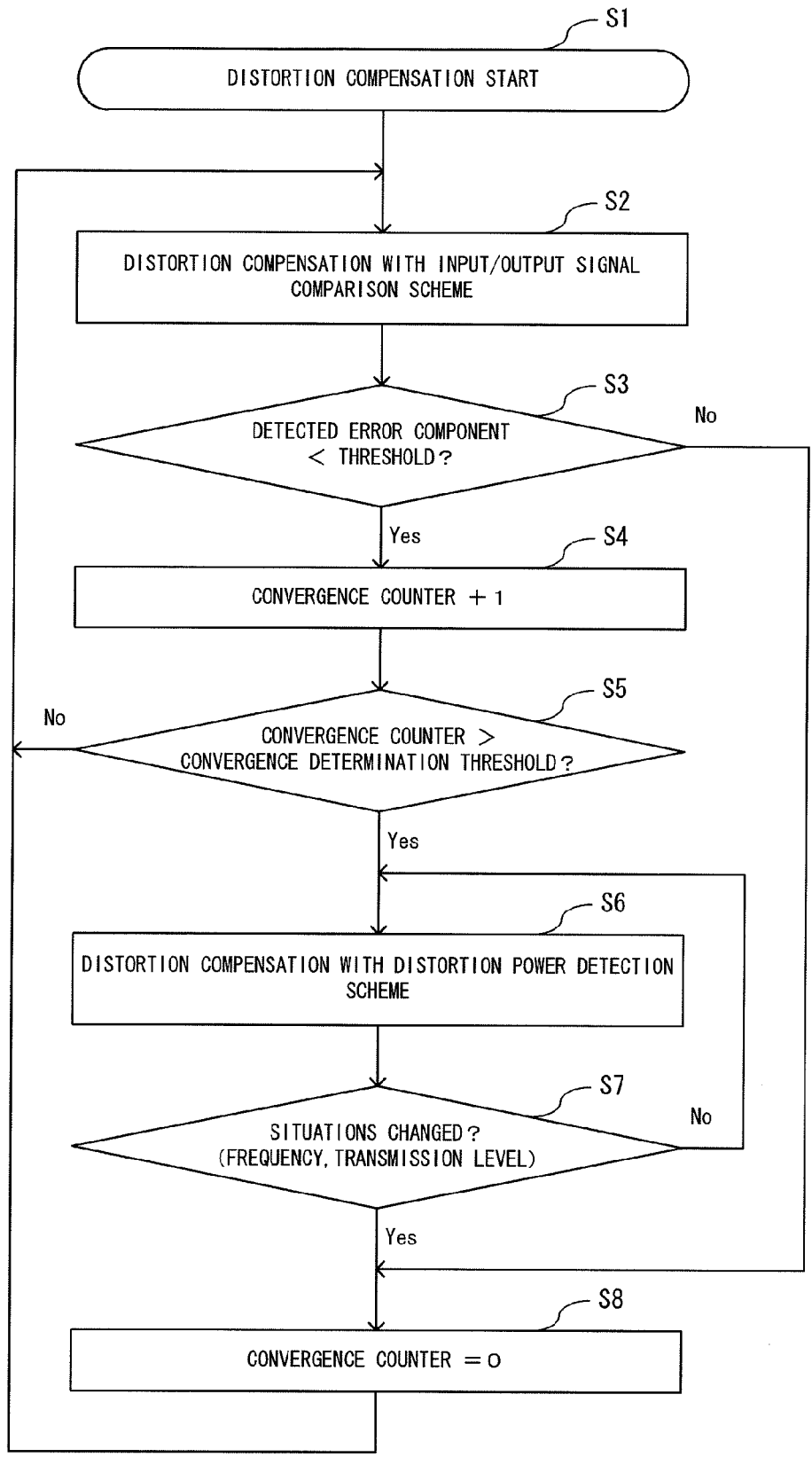
FIG. 2 is a diagram showing an exemplary procedure of function switching processing according to one embodiment of the present invention.
Figure 3:
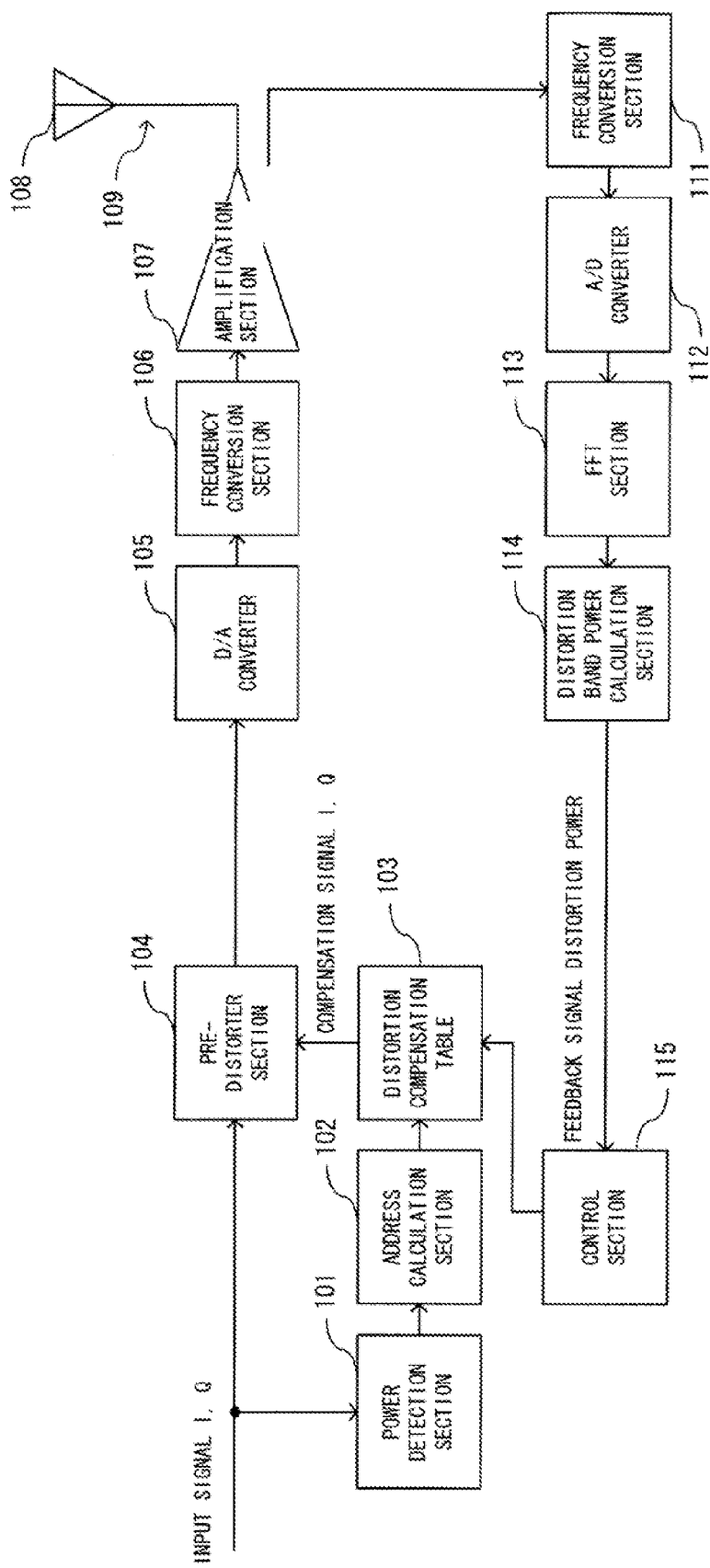
FIG. 3 is a diagram showing a configuration example of a distortion compensation amplifier in the prior art.
Figure 4:
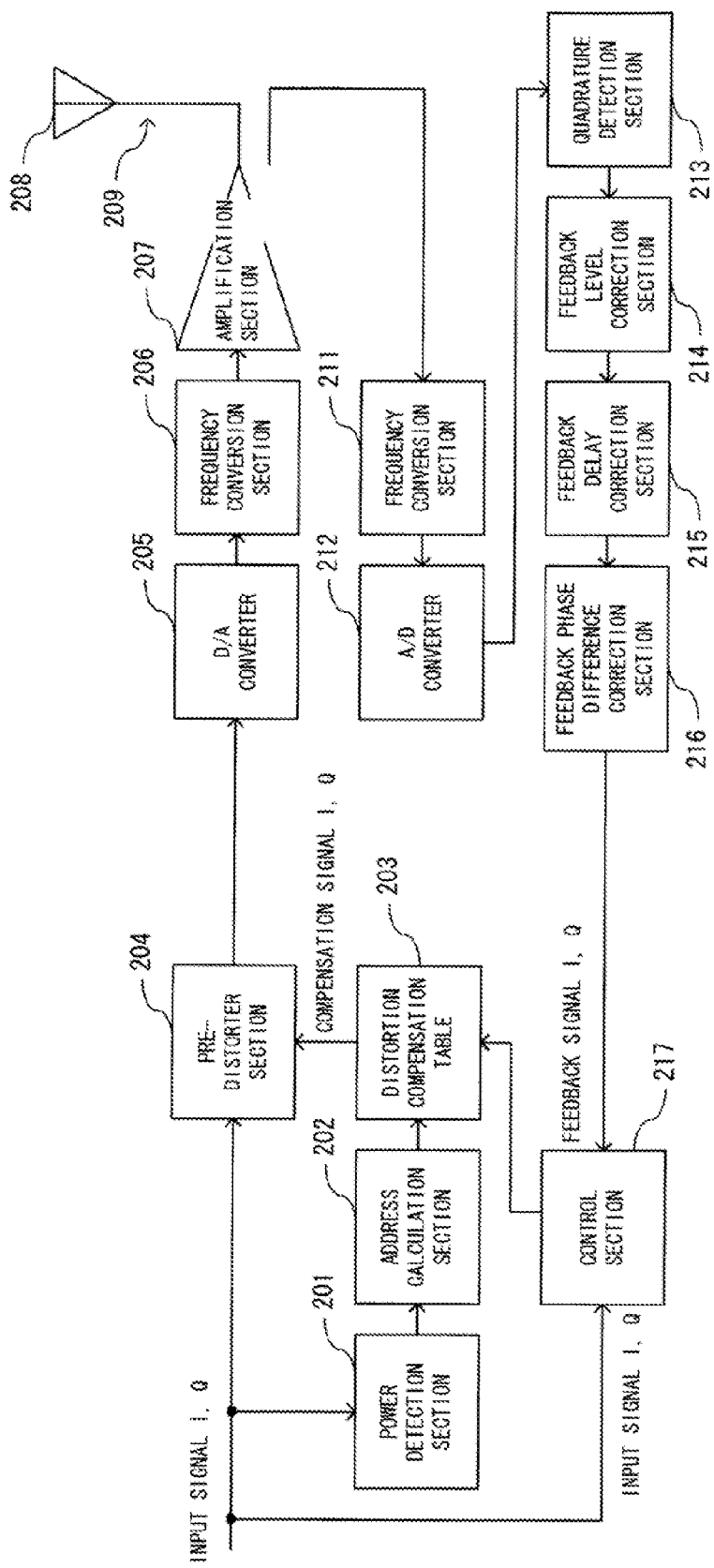
FIG. 4 is a diagram showing a configuration example of a distortion compensation amplifier in the prior art.

FIG. 2 shows an exemplary flow chart of processing of selectively switching between the two distortion compensation operation functions (the first control mode and the second control mode) by the control section 19.

The control section 19 of the present example has the function of a predetermined convergence counter.

First, the distortion compensation processing is started (step S1). At the time of initial distortion compensation, a mode of distortion compensation (the first control mode in the present example) with the input/output signal comparison scheme is set. Data from the feedback phase difference correction section 16 is selected as feedback data for use in the distortion compensation control (step S2). In the input/output signal comparison mode, the input signal and the feedback signal are compared and the distortion compensation table 3 is adaptively controlled so as to reduce the error component between them.

In the input/output signal comparison mode (the first control mode in the present example), the magnitudes of the detected error component and a predetermined threshold (previously set and stored in a memory, for example) are compared. When it is determined as the result of the comparison that the detected error component is equal to or higher than the set threshold (or may be larger than the threshold), the value of the convergence counter is cleared to zero (step S8), and the processing in the input/output signal comparison mode is continuously performed (the control section 19 returns to the processing at step S2).

On the other hand, when it is determined as the result of the abovementioned comparison that the detected error component is smaller than the set threshold (or may be equal to or smaller than the threshold) (step S3), the value of the convergence counter is increased by one, that is, one is added to the value of the convergence counter (step S4).

The magnitudes of the value of the convergence counter and a convergence determination threshold which is a predetermined threshold (previously set and stored in a memory, for example) are compared (step S5). When it is determined that the value of the convergence counter is larger than the convergence determination threshold (or may be equal to or larger than the convergence determination threshold) and that sufficient convergence is achieved, then the mode is changed by switching to a mode with the distortion power detection scheme (the second control mode in the present example) (step S6). Otherwise, the processing in the input/output signal comparison mode is continuously performed.

In the abovementioned distortion power detection mode, the data from the distortion band power calculation section 18 is selected as feedback data. In the distortion power detection mode, the distortion compensation table 3 is adaptively controlled so as to reduce the detected distortion power.

In the distortion power detection mode, whether predetermined situations have been changed or not is monitored and determined such as the change of the frequency (of the transmission signal, for example) and the change of the transmission level. When it is determined that the predetermined situations have been changed (step S7), the value of the convergence counter is cleared to zero (step S8). Switching is made to the input/output signal comparison mode (the first control mode in the present example) to return to the processing (the control section 19 returns to the processing at step S2).

As described above, in the present example, the distortion compensation amplifier using the pre-distortion scheme has the first technique (the first control mode in the present example) in which the input and output signals are compared to perform the pre-distortion and the second technique (the second control mode in the present example) in which the distortion power is detected to perform the pre-distortion. Of the two techniques, the first technique is used at the time of the initial convergence of distortion compensation, at the time of the change of the transmission frequency, or at the time of the change of the transmission level. Then, when it is determined that the convergence is achieved to a predetermined degree, switching is made to the use of the second technique.

Specifically, the distortion compensation amplifier of the present example includes the power detection section 1 detecting the power value (or the amplitude value) of the input signal, the address calculation section 2 converting the power value (or the amplitude value) detected by the power detection section 1 into the address for the distortion compensation table 3, the distortion compensation table 3 having the inverse characteristics of the amplifier stored therein, the pre-distorter section 4 performing the complex multiplication of the distortion compensation signal from the distortion compensation table 3 and the input signal, the D/A converter 5 converting the digital signal into the analog signal, the frequency conversion section 6 performing the frequency conversion of the analog signal output from the D/A converter 5 into the signal of the RF frequency, the amplification section 7 amplifying the RF signal, the frequency conversion section 11 performing the frequency conversion of part of the output from the amplification section 7 into the signal of the IF frequency, the A/D converter 12 converting the analog signal into the digital signal, the quadrature detection section 13 quadrature-detects the signal from the A/D converter 12 into the IQ signal, the level correction section 14 performing the level correction of the input/output signals, the delay correction section 15 performing the delay correction of the input/output signals, the phase difference correction section performing the phase difference correction of the input/output signals, the FFT section 17 FFT-processing and converting the signal from the A/D converter 12 into the frequency-base data, the distortion band power detection section 18 performing the detection of the distortion power, and the control section 19 having the first function of comparing the input/output signals and adaptively controlling the distortion compensation table 3 so as to reduce the error and the second function of adaptively controlling the distortion compensation table 3 so as to reduce the distortion power and selecting one of the two distortion compensation control functions according to the circumstances.

Thus, when the distortion compensation amplifier of the present example amplifies the input signal with the amplifier (the amplifier of the amplification section 7 in the present example) by providing the predetermined distortion of the inverse characteristics of the distortion produced in the amplifier to achieve the distortion compensation with the pre-distortion scheme, it is possible to reduce the convergence time (accelerate the convergence) and perform the stable distortion compensation operation at the same time, so that the overall distortion compensation performance can be improved.

In the distortion compensation amplifier of the present example, the level detecting means is configured by the function of the power detection section 1, the distortion compensation aspect storing means is configured by the function of the distortion compensation table 3, the distortion providing means is configured by the function of the pre-distorter section 4, the amplifying means is configured by the function of the amplification section 7, the feedback signal obtaining means is configured by the functions of the directional coupler 9, the frequency conversion section 11, the A/D converter 12, the quadrature detection section 13, the feedback level correction section 14, the feedback delay correction section 15, and the feedback phase difference correction section 16, the distortion level detecting means is configured by the functions of the directional coupler 9, the frequency conversion section 11, the A/D converter 12, the FFT section 17, and the distortion band power calculation section 18, and the control means is configured by the function of the control section 19.

The configurations of the system and the apparatus according to the present invention are not necessarily limited to the abovementioned ones, and various configurations may be used. The present invention can be provided as a method or a scheme for performing the processing according to the present invention or a program for realizing the method or the scheme or a recording medium for recording the program, for example, or may be provided as various systems or apparatuses.

The field to which the present invention is applied is not necessarily limited to the abovementioned ones, and the present invention is applicable to various fields.

The various types of processing performed in the system, the apparatus and the like according to the present invention may be configured to be controlled by a processor executing a control program stored in ROM (Read Only Memory) in a hardware resource including a processor, a memory and the like, or each of the functional means for performing the processing may be configured as an independent hardware circuit, for example.

The present invention may be provided as a computer readable recording medium such as a floppy disk (R) and a CD (Compact Disc)-ROM having the abovementioned control program stored therein or as the program. The control program may be input from the recording medium to a computer and executed by a processor, thereby performing the processing according to the present invention.

The invention claimed is:

1. A distortion compensation amplifier performing distortion compensation with a pre-distortion scheme, comprising:
   level detecting means for detecting a level of a signal to be amplified;
   distortion compensation aspect storing means for storing a distortion compensation aspect associated with the level detected by the level detecting means;
   distortion providing means for providing distortion of pre-distortion for the signal to be amplified in the distortion compensation aspect associated with the level detected by the level detecting means based on a storage content of the distortion compensation aspect storing means;
   amplifying means for amplifying the signal provided with the distortion of pre-distortion by the distortion providing means;
   feedback signal taking means for performing detection of the signal amplified by the amplifying means to take a feedback signal;
   distortion level detecting means for detecting a level of distortion contained in the feedback signal for the signal amplified by the amplifying means; and
   control means for performing switching such that first update processing of updating the storage content of the distortion compensation aspect storing means is performed so as to reduce an error component between the signal to be amplified and the feedback signal taken by the feedback signal taking means at the time of start of distortion compensation processing and second update processing of updating the storage content of the distortion compensation aspect storing means is performed so as to reduce the level of distortion detected by the distortion level detecting means when the error component is reduced to satisfy a predetermined condition using a predetermined threshold.

2. The distortion compensation amplifier according to claim 1, wherein the control means performs the first update processing at the time of initial distortion compensation, compares magnitudes of the error component and a predetermined first threshold, clears a value of a predetermined counter to zero and continuously performs the first update processing when it is determined that a first condition is not satisfied, the first condition being that the error component should be smaller than the first threshold or be equal to or smaller than the first threshold, or when it is determined that the first condition is satisfied, the control means adds one to the value of the counter and then compares magnitudes of the value of the counter and a predetermined second threshold, and switches to perform the second update processing when it is determined that a second condition is satisfied, the second condition being that the value of the counter should be larger than the second threshold or be equal to or larger than the second threshold, or when it is determined that the second condition is not satisfied, the control means continuously performs the first update processing.

3. The distortion compensation amplifier according to claim 2, wherein the control means monitors and determines whether predetermined situations have been changed or not in the second update processing, and clears the value of the counter to zero and switches to perform the first update processing when it is determined that the predetermined situations have been changed.

4. The distortion compensation amplifier according to claim 1, further comprising:
   a power detection section detecting a power value of an I, Q input signal to be amplified;
   an address calculation section calculating a reference address based on the power value detected by the power detection section;
   a distortion compensation table having correspondence between the reference address and a compensation signal of I, Q serving as a distortion compensation value stored therein and outputting the distortion compensation value associated with the reference address calculated by the address calculation section;
   a pre-distorter section performing complex multiplication of the distortion compensation value output from the distortion compensation table and the input signal to provide distortion of pre-distortion for the input signal;
   a D/A converter converting the signal provided with the distortion by the pre-distorter section from digital signal to analog signal;
   a first frequency conversion section frequency-converting the signal converted by the D/A converter into a signal of radio frequency band;
   an amplification section amplifying the signal frequency-converted by the first frequency conversion section;
   a directional coupler taking part of the signal amplified by the amplification section;
   a second frequency conversion section frequency-converting the signal taken by the directional coupler into a signal of intermediate frequency band;
   an A/D converter converting the signal frequency-converted by the second frequency conversion section from analog signal to digital signal;
   a quadrature detection section quadrature-detecting the signal converted by the A/D converter to obtain a feedback signal of I, Q;
   a feedback level correction section adjusting a level of the feedback signal obtained by the quadrature detection section to adjust the relationship between the levels of the input signal and the feedback signal;
   a feedback delay correction section adjusting a delay of the feedback signal obtained by the quadrature detection section to adjust the relationship between the delays of the input signal and the feedback signal;
   a feedback phase difference correction section adjusting a phase difference of the feedback signal obtained by the quadrature detection section to adjust the relationship between the phase differences of the input signal and the feedback signal;
   an FFT section performing FFT processing on the signal converted by the A/D converter to convert the signal from time data to frequency-base data;
   a distortion band power calculation section calculating a power value of a distortion component contained in the feedback signal based on the frequency-base data converted by the FFT section; and
   a control section selectively switching according to the circumstances between first update processing of updating a content of the distortion compensation table so as to reduce an error component between the input signal and the feedback signal and second update processing of updating the content of the distortion compensation table so as to reduce the power value of the distortion component calculated by the distortion band power calculation section,
   wherein the level detecting means is configured by a function of the power detection section, the distortion compensation aspect storing means is configured by a function of the distortion compensation table, the distortion providing means is configured by a function of the pre-distorter section, the amplifying means is configured by a function of the amplification section, the feedback signal obtaining means is configured by functions of the directional coupler, the second frequency conversion section, the A/D converter, the quadrature detection section, the feedback level correction section, the feedback delay correction section, and the feedback phase difference correction section, the distortion level detecting means is configured by functions of the directional coupler, the second frequency conversion section, the A/D converter, the FFT section, and the distortion band power calculation section, and the control means is configured by a function of the control section.

5. The distortion compensation amplifier according to claim 2, further comprising:
   a power detection section detecting a power value of an I, Q input signal to be amplified;
   an address calculation section calculating a reference address based on the power value detected by the power detection section;
   a distortion compensation table having correspondence between the reference address and a compensation signal of I, Q serving as a distortion compensation value stored therein and outputting the distortion compensation value associated with the reference address calculated by the address calculation section;
   a pre-distorter section performing complex multiplication of the distortion compensation value output from the distortion compensation table and the input signal to provide distortion of pre-distortion for the input signal;
   a D/A converter converting the signal provided with the distortion by the pre-distorter section from digital signal to analog signal;
   a first frequency conversion section frequency-converting the signal converted by the D/A converter into a signal of radio frequency band;
   an amplification section amplifying the signal frequency-converted by the first frequency conversion section;

a directional coupler taking part of the signal amplified by the amplification section;

a second frequency conversion section frequency-converting the signal taken by the directional coupler into a signal of intermediate frequency band;

an A/D converter converting the signal frequency-converted by the second frequency conversion section from analog signal to digital signal;

a quadrature detection section quadrature-detecting the signal converted by the A/D converter to obtain a feedback signal of I, Q;

a feedback level correction section adjusting a level of the feedback signal obtained by the quadrature detection section to adjust the relationship between the levels of the input signal and the feedback signal;

a feedback delay correction section adjusting a delay of the feedback signal obtained by the quadrature detection section to adjust the relationship between the delays of the input signal and the feedback signal;

a feedback phase difference correction section adjusting a phase difference of the feedback signal obtained by the quadrature detection section to adjust the relationship between the phase differences of the input signal and the feedback signal;

an FFT section performing FFT processing on the signal converted by the A/D converter to convert the signal from time data to frequency-base data;

a distortion band power calculation section calculating a power value of a distortion component contained in the feedback signal based on the frequency-base data converted by the FFT section; and a control section selectively switching according to the circumstances between first update processing of updating a content of the distortion compensation table so as to reduce an error component between the input signal and the feedback signal and second update processing of updating the content of the distortion compensation table so as to reduce the power value of the distortion component calculated by the distortion band power calculation section, wherein the level detecting means is configured by a function of the power detection section, the distortion compensation aspect storing means is configured by a function of the distortion compensation table, the distortion providing means is configured by a function of the pre-distorter section, the amplifying means is configured by a function of the amplification section, the feedback signal obtaining means is configured by functions of the directional coupler, the second frequency conversion section, the A/D converter, the quadrature detection section, the feedback level correction section, the feedback delay correction section, and the feedback phase difference correction section, the distortion level detecting means is configured by functions of the directional coupler, the second frequency conversion section, the A/D converter, the FFT section, and the distortion band power calculation section, and the control means is configured by a function of the control section.

6. The distortion compensation amplifier according to claim 3, further comprising:

a power detection section detecting a power value of an I, Q input signal to be amplified;

an address calculation section calculating a reference address based on the power value detected by the power detection section;

a distortion compensation table having correspondence between the reference address and a compensation signal of I, Q serving as a distortion compensation value stored therein and outputting the distortion compensation value associated with the reference address calculated by the address calculation section;

a pre-distorter section performing complex multiplication of the distortion compensation value output from the distortion compensation table and the input signal to provide distortion of pre-distortion for the input signal;

a D/A converter converting the signal provided with the distortion by the pre-distorter section from digital signal to analog signal;

a first frequency conversion section frequency-converting the signal converted by the D/A converter into a signal of radio frequency band;

an amplification section amplifying the signal frequency-converted by the first frequency conversion section;

a directional coupler taking part of the signal amplified by the amplification section;

a second frequency conversion section frequency-converting the signal taken by the directional coupler into a signal of intermediate frequency band;

an A/D converter converting the signal frequency-converted by the second frequency conversion section from analog signal to digital signal;

a quadrature detection section quadrature-detecting the signal converted by the A/D converter to obtain a feedback signal of I, Q;

a feedback level correction section adjusting a level of the feedback signal obtained by the quadrature detection section to adjust the relationship between the levels of the input signal and the feedback signal;

a feedback delay correction section adjusting a delay of the feedback signal obtained by the quadrature detection section to adjust the relationship between the delays of the input signal and the feedback signal;

a feedback phase difference correction section adjusting a phase difference of the feedback signal obtained by the quadrature detection section to adjust the relationship between the phase differences of the input signal and the feedback signal;

an FFT section performing FFT processing on the signal converted by the A/D converter to convert the signal from time data to frequency-base data;

a distortion band power calculation section calculating a power value of a distortion component contained in the feedback signal based on the frequency-base data converted by the FFT section; and a control section selectively switching according to the circumstances between first update processing of updating a content of the distortion compensation table so as to reduce an error component between the input signal and the feedback signal and second update processing of updating the content of the distortion compensation table so as to reduce the power value of the distortion component calculated by the distortion band power calculation section, wherein the level detecting means is configured by a function of the power detection section, the distortion compensation aspect storing means is configured by a function of the distortion compensation table, the distortion providing means is configured by a function of the pre-distorter section, the amplifying means is configured by a function of the amplification section, the feedback signal obtaining means is configured by functions of the directional coupler, the second frequency conversion section, the A/D converter, the quadrature detection section, the feedback level correction section, the feedback delay correction section, and the feedback phase difference correction section, the distortion level detecting means is configured by functions of the directional coupler, the second frequency conversion section, the A/D converter, the FFT section, and the distortion band power calculation section, and the control means is configured by a function of the control section.

* * * * *